United States Patent
Kato et al.

(10) Patent No.: US 8,860,121 B2
(45) Date of Patent: Oct. 14, 2014

(54) SEMICONDUCTOR DEVICE HAVING UPPER LAYER PORTION OF SEMICONDUCTOR SUBSTRATE DIVIDED INTO A PLURALITY OF ACTIVE AREAS

(75) Inventors: Yoshiko Kato, Kanagawa-ken (JP); Mitsuhiro Noguchi, Kanagawa-ken (JP); Hiroyuki Kutsukake, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 854 days.

(21) Appl. No.: 12/725,848

(22) Filed: Mar. 17, 2010

(65) Prior Publication Data
US 2011/0062509 A1    Mar. 17, 2011

(30) Foreign Application Priority Data
Sep. 15, 2009    (JP) ................. 2009-212793

(51) Int. Cl.
  *H01L 29/792*    (2006.01)
  *H01L 29/78*    (2006.01)
  *H01L 27/115*    (2006.01)
  *H01L 29/66*    (2006.01)
  *H01L 29/10*    (2006.01)

(52) U.S. Cl.
  CPC .... *H01L 27/11529* (2013.01); *H01L 27/11521* (2013.01); *H01L 27/11551* (2013.01); *H01L 29/66825* (2013.01); *H01L 29/1083* (2013.01); *H01L 27/11526* (2013.01)
  USPC .... 257/324; 257/314; 257/315; 257/E27.132; 257/E27.133

(58) Field of Classification Search
  USPC .......... 257/324, 315, 314, E27.132, E27.133; 250/214.1, 208.1, 214 A
  See application file for complete search history.

(56) References Cited

U.S. PATENT DOCUMENTS

| | | | |
|---|---|---|---|
| 6,184,516 B1* | 2/2001 | Sawada et al. | 250/214.1 |
| 7,371,672 B2* | 5/2008 | Matsuzaki | 438/593 |
| 7,825,463 B2* | 11/2010 | Kim | 257/332 |
| 8,003,485 B2* | 8/2011 | Cho et al. | 438/424 |

(Continued)

FOREIGN PATENT DOCUMENTS

| | | |
|---|---|---|
| JP | 9-74189 A | 3/1997 |
| JP | 2005-340579 A | 12/2005 |

(Continued)

OTHER PUBLICATIONS

Korean Office Action issued May 25, 2011, in Patent Application No. 10-2010-0020315 (with English-language translation).

(Continued)

*Primary Examiner* — Alexander Ghyka
(74) *Attorney, Agent, or Firm* — Oblon, Spivak, McClelland, Maier & Neustadt, L.L.P.

(57) ABSTRACT

A semiconductor memory device includes: a semiconductor substrate; a plurality of element isolation insulators disposed in parts of an upper layer portion of the semiconductor substrate and dividing the upper layer portion into a plurality of active areas extended in one direction; tunnel insulating films provided on the active areas: charge storage members provided on the tunnel insulating films; and control gate electrodes provided on the charge storage members. A width of a middle portion of one of the active areas in the up-to-down direction being smaller than a width of a portion of the active areas upper of the middle portion and a width of a portion of the active areas below the middle portion.

5 Claims, 12 Drawing Sheets

(56) References Cited

U.S. PATENT DOCUMENTS

| | | |
|---|---|---|
| 2005/0179078 A1* | 8/2005 | Lee ............................. 257/314 |
| 2006/0231918 A1 | 10/2006 | Popp et al. |
| 2006/0284268 A1 | 12/2006 | Matsunaga |
| 2007/0207581 A1* | 9/2007 | Yasui et al. .................... 438/257 |
| 2008/0105916 A1* | 5/2008 | Watanabe ...................... 257/315 |
| 2008/0157194 A1* | 7/2008 | Lee et al. ....................... 257/334 |
| 2009/0017594 A1* | 1/2009 | Sumino et al. ................. 438/424 |
| 2009/0239365 A1* | 9/2009 | Matsunaga .................... 438/587 |
| 2009/0242969 A1* | 10/2009 | Tanaka .......................... 257/324 |
| 2010/0032747 A1* | 2/2010 | Okamura et al. .............. 257/326 |
| 2010/0155812 A1 | 6/2010 | Morikado et al. |

FOREIGN PATENT DOCUMENTS

| | | |
|---|---|---|
| JP | 2006-186073 | 7/2006 |
| JP | 2006-351789 | 12/2006 |
| JP | 2008-118007 A | 5/2008 |
| JP | 2008-205187 | 9/2008 |
| KR | 10-2007-0106923 | 11/2007 |
| KR | 10-2008-0041590 | 5/2008 |
| WO | WO 2005/041307 A1 | 5/2005 |

OTHER PUBLICATIONS

Office Action issued Feb. 4, 2014, in Japanese Patent Application No. 2009-212793 with English translation.

Notification of Reason(s) for Refusal issued Jun. 24, 2013 in Japanese Patent Application No. 2009-212793 (with English translation).

* cited by examiner

SEMICONDUCTOR DEVICE HAVING UPPER LAYER PORTION OF SEMICONDUCTOR SUBSTRATE DIVIDED INTO A PLURALITY OF ACTIVE AREAS

CROSS-REFERENCE TO RELATED APPLICATIONS

This application is based upon and claims the benefit of priority from the prior Japanese Patent Application No. 2009-212793, filed on Sep. 15, 2009; the entire contents of which are incorporated herein by reference.

BACKGROUND

1. Field

Embodiments of the invention relate generally to a semiconductor memory device.

2. Background Art

Recently, semiconductor devices, such as the NAND-type flash memory, etc., are mounted on many electronic instruments. Such electronic instruments are required to have a wide variety of functions, which requires the mounted semiconductor devices to have large capacities, with a result that the memory elements are required to be highly integrated. To highly integrate the memory elements, the memory elements themselves must be shrank while the inter-element regions isolating the memory elements must be shrank.

For example, in the NAND-type flash memory, usually a memory transistor of the MOSFET (Metal-Oxide-Semiconductor Field-Effect Transistor) structure including a floating gate electrode and a control gate electrode stacked is usually used as the memory element. In the NAND-type flash memory, a plurality of such memory transistors are serially connected, forming a NAND string. The NAND string has one end connected to a bit line via a selection gate transistor and the other end connected to a source line via another selection gate transistor. In each NAND string, the memory transistors adjacent to each other have the source/drain regions in common. (Refer to, e.g., FIG. 19 of JP-A 2006-351789). Accompanying the increase of the capacity of the NAND-type flash memory, the memory transistors themselves are required to be shrank, and at the same time, the inter-element regions isolating the memory transistors is required to be shrank.

However, shrinking of the inter-element regions tends to cause interferences between the adjacent memory transistors. For example, in the data programming operation of the NAND-type flash memory, the "programming error", that data are erroneously stored in non-selected memory cells the data are not to be stored in, is occurred easily.

SUMMARY

According to an aspect of the invention, there is provided a semiconductor memory device including: a semiconductor substrate; a plurality of element isolation insulators disposed in parts of an upper layer portion of the semiconductor substrate and dividing the upper layer portion into a plurality of active areas extended in one direction; tunnel insulating films provided on the active areas: charge storage members provided on the tunnel insulating films; and control gate electrodes provided on the charge storage members, a width of a middle portion of one of the active areas in the up-to-down direction being smaller than a width of a portion of the active areas upper of the middle portion and a width of a portion of the active areas below the middle portion.

According to another aspect of the invention, there is provided a semiconductor memory device including: a semiconductor substrate; an element isolation insulator disposed in an upper layer portion of the semiconductor substrate and dividing the upper layer portion into semiconductor regions; a gate electrode provided on a part of the area immediately above one of the semiconductor regions; a gate insulating film provided between the one of the semiconductor regions and the gate electrode; and a pair of source/drain regions formed in regions of the one of the semiconductor regions sandwiching an area immediately below the gate electrode, a width of a portion of the one of the semiconductor regions below a portion including the source/drain regions being smaller than a width of the portion including the source/drain regions.

According to still another aspect of the invention, there is provided a semiconductor memory device including: a semiconductor substrate; an element isolation insulator disposed in an upper layer portion of the semiconductor substrate and dividing the upper layer portion into semiconductor regions; and an impurity diffusion region formed in a part of an upper portion of the one of the semiconductor regions, a width of the one of the semiconductor regions being minimum at a portion below the impurity diffusion region.

DETAILED DESCRIPTION

Embodiments of the invention will be described with reference to the drawings.

First, a first embodiment of the invention will be described.

Figure 1:
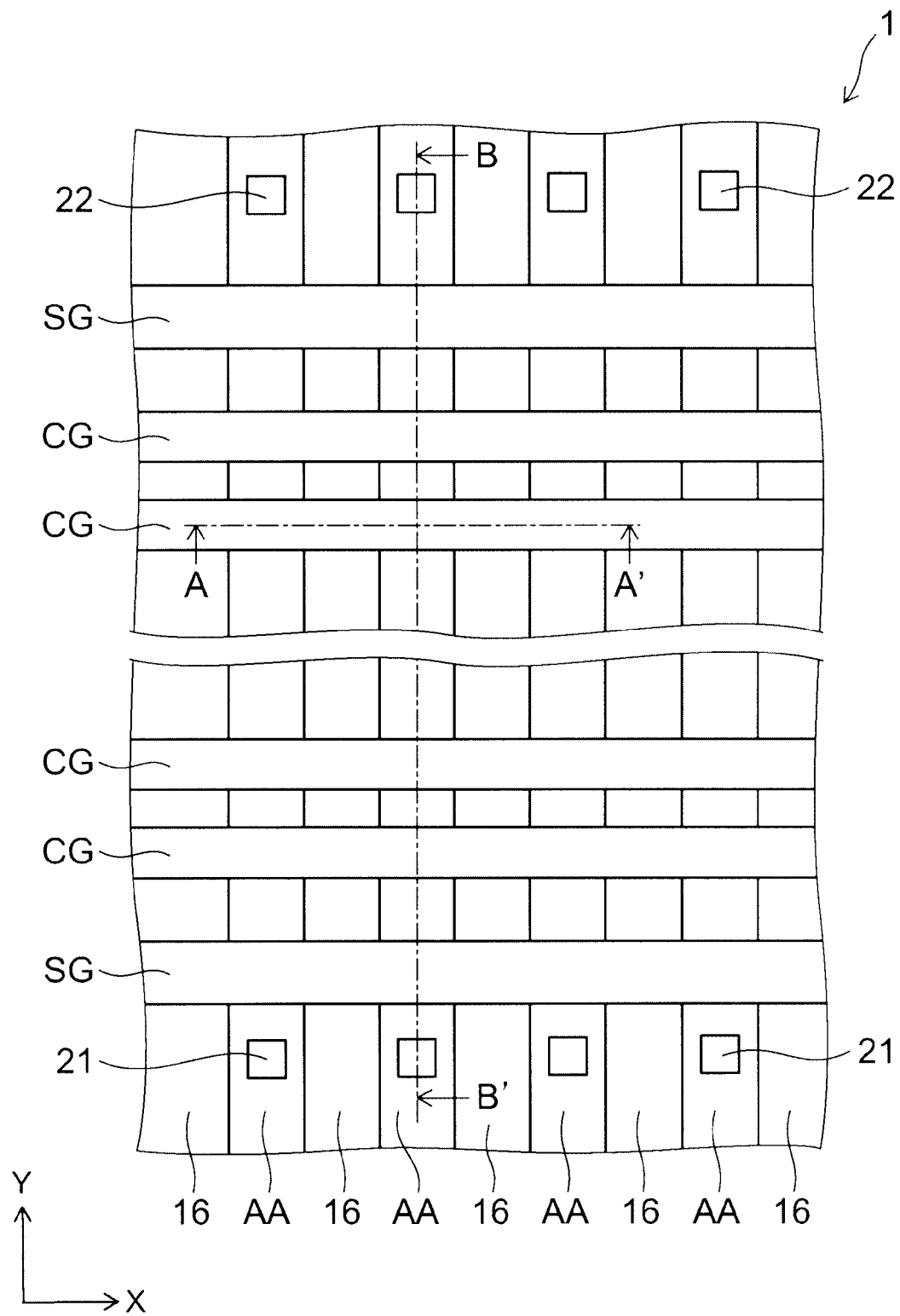
FIG. 1 is a plan view illustrating a semiconductor memory device according to a first embodiment of the invention.

FIG. 1 is a plan view illustrating a semiconductor memory device according to this embodiment.

Figure 2:
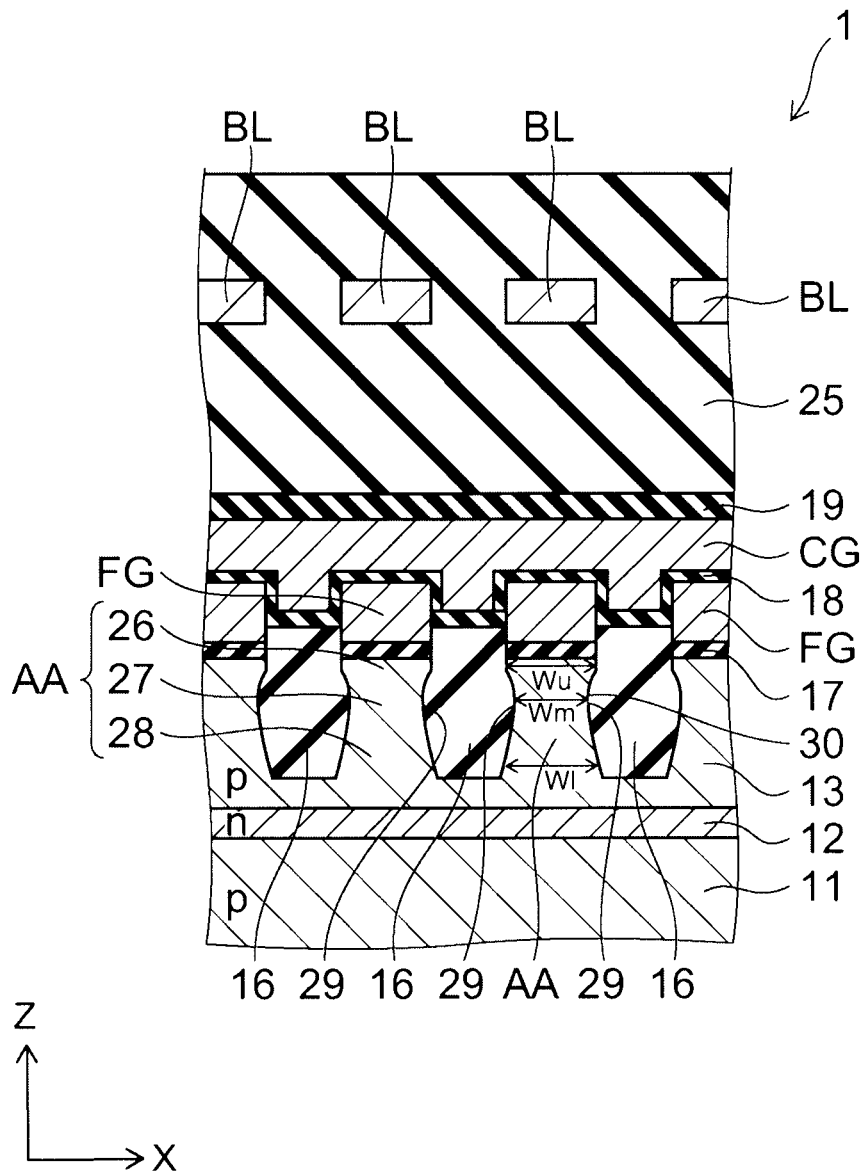
FIG. 2 is a cross-sectional view along the A-A' line in FIG. 1.

FIG. 2 is a cross-sectional view along the A-A' line in FIG. 1.

Figure 3:
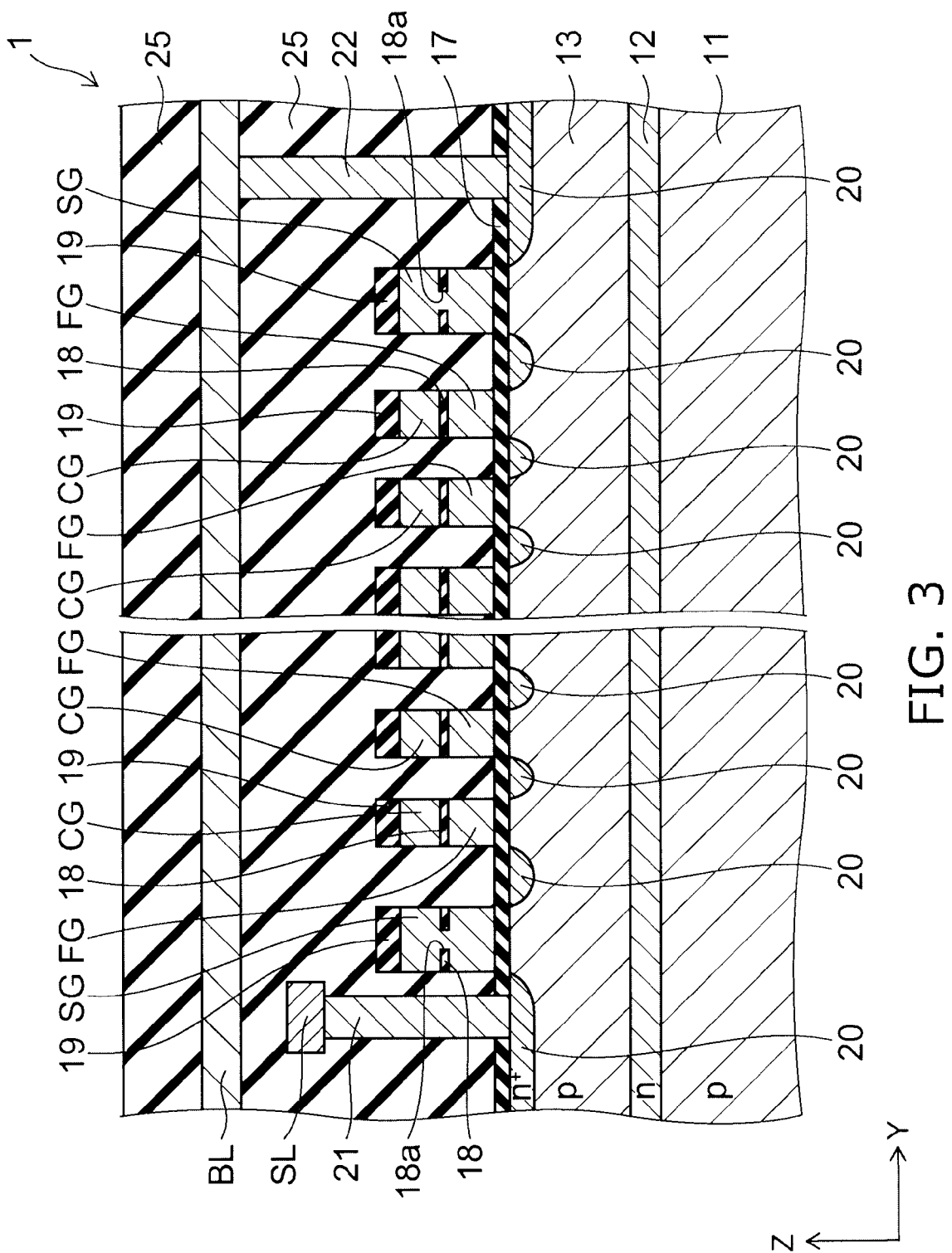
FIG. 3 is a cross-sectional view along the B-B' line in FIG. 1.

FIG. 3 is a cross-sectional view along the B-B' line in FIG. 1.

First, a characteristic part of this embodiment will be described.

A characteristic of this embodiment is that a NAND-type flash memory having an upper layer portion of a silicon substrate divided into line-shaped active areas by element isolation insulators formed by STI (shallow trench isolation) has a width of the middle portions of the active areas as viewed in the up-to-down direction made smaller than a width of the upper portions (tops) and a width of the lower portions (bottoms). That is, as viewed in the direction of extension of the active areas, the active areas have a convergent-divergent configuration which is relatively thicker at the tops and bottoms and relatively thinner at the middle portions.

Thus, while a sufficient cell current is flowed at the tops of the active areas, the depletion layers can be easily extendable downward, and the capacitance between the silicon substrate and the floating gate electrodes can be reduced. Consequently, the active areas become invulnerable to electric influences of the adjacent active areas. At the bottoms of the active areas, where the width is larger, the depletion layers can be suppressed from extending downward. Thus, the depletion layers are prevented from exceeding the lower ends of the element isolation insulators and intruding into the adjacent active areas, and the punch-through can be prevented.

Next, the configuration of the semiconductor memory device according to this embodiment will be detailed.

As illustrated in FIGS. 1 to 3, the semiconductor memory device 1 (herein after also called "device 1") according to this embodiment is a NAND-type flash memory and, for example, a NAND-type EEPROM (Electrically Erasable and Programmable Read Only Memory). The device 1 includes a silicon substrate 11 of, e.g., p-conduction type.

The silicon substrate 11 has a memory array region and a peripheral circuit region. The memory array region has a plurality of memory transistors as the memory elements storing data. The peripheral circuit region has a peripheral circuit including high voltage transistors and low voltage transistors, etc. driving the memory transistors. The peripheral circuit generates voltages of plural levels and supplies the voltages to the memory array region and detects voltages or currents generated in the memory array region. As described above, a characteristic of this embodiment is the configuration of the active areas in the memory array region. The memory array region will be described below.

In the memory array region, an n-type well 12 is formed in an upper layer portion of the silicon substrate 11, and a p-type well 13 is formed in the region of an upper layer portion of the n-type well 12. At parts of an upper layer portion in the p-type well 13, a plurality of element isolation insulators 16 extended in one direction are disposed. The element isolation insulators 16 are, e.g., silicon oxide. The element isolation insulators 16 divide the upper portion of the p-type well 13 in a plurality of active areas AA (semiconductor regions).

In this specification, for the convenience of explanation, the XYZ orthogonal coordinate system is used. That is, of the directions parallel with the upper surface of the silicon substrate 11, the direction in which the element isolation insulators 16 and the active areas AA are extended is the Y direction, and the direction orthogonal to the Y direction is the X direction. The direction perpendicular to the upper surface of the silicon substrate 11 is the Z direction.

On the active areas AA, a tunnel insulating film 17 of silicon oxide is disposed. The tunnel insulating film 17 is usually insulating but is a film which permits a tunnel current when a prescribed voltage in the range of a drive voltage of the device 1 is applied. On the tunnel insulating film 17, floating gate electrodes FG of a conductive material, e.g., polysilicon with an impurity implanted are provided as charge storage members are provided. The floating gate electrodes FG are provided in the X direction for the respective active areas AA. Accordingly, the floating gate electrodes FG are disposed in a matrix in the X direction and the Y direction.

On the floating gate electrodes FG, an inter-gate insulating film 18 of, e.g., silicon oxide or alumina is disposed. On the inter-gate insulating film 18, a control gate electrode CG of a conductive material, e.g., polysilicon with an impurity implanted is disposed. The control gate electrode CG is linearly extended in the X direction and is passed very above the plural floating gate electrodes FG. A plurality of the control gate electrodes CG are provided in the Y direction.

On both sides of the region in the Y direction, where the plural control gate electrodes CG are provided, select gate electrodes SG extended in the X direction are disposed. The select gate electrodes SG are formed of the polysilicon same as the floating gate electrodes FG and the polysilicon same as the control gate electrodes CG, which are integrated with each other via openings 18a of the inter-gate insulating film 18. On the control gate electrodes CG and the select gate electrodes SG, an insulating film 19 is disposed.

N-type diffusion regions 20 are disposed in the regions of the uppermost layer portions of the active areas AA except the areas very below the control gate electrodes CG and the areas very below the select gates SG. In other words, in the active areas AA, the n-type diffusion regions 20 are disposed, sandwiching the areas very below the control gate electrodes in the Y direction. That is, the n-type diffusion regions 20 are disposed, interrupted in the Y direction in the respective active areas AA.

On one ends of the respective active areas AA, contact plugs 21 are provided in contact with one ends of the active areas AA. On the contact plugs 21, linear source lines SL are disposed, extended in the X direction. The source lines SL are extended over a plurality of the active areas AA and are commonly connected to these active areas AA via the contact plugs 21. On the other hand, on the other ends of the respective active areas AA, contact plugs 22 are disposed in contact with the other ends of the active areas AA. On the contact plugs 22, linear bit lines BL are disposed, extended in the Y direction. For the convenience of the illustration, in FIG. 1, the source lines SL and the bit lines BL are omitted.

The plural control electrodes CG and a pair of the select gate electrodes SG provided on both side thereof, which have been described above, are disposed between the associated contact plug 21 and the associated contact plug 22. That is, in each active area AA, the portion very below the control gate electrode CG is sandwiched by the portion connected to the source line SL ad the portion connected to the bit line BL. The contact plugs 21, 22, the source lines SL and the bit lines BL formed of, e.g., metal.

On the silicon substrate 11, an inter-layer insulating film 25 of, e.g., silicon oxide is disposed, burying the floating gate electrodes FG, the inter-gate insulating film 18, the control gate electrodes CG and the select gate electrodes SG. For example, the inter-layer insulating film 25 is integrally in contact with the insulating film 19 and the element isolation insulators 16.

In this embodiment, the sectional form of the active areas AA is convergent-divergent as viewed in the Y direction. That is, as each active area AA is divided in the top 26, the middle portion 27 and the bottom 28 from the top in the up-to-down direction, the side surfaces 29 of the active area AA faced in the X direction are concave in the middle portion 27. The element isolation insulators 16 disposed on both sides of the active area AA bulge to a concavity of the active area AA. Thus, the width Wm of the middle portion 27 of the active area AA is smaller than the width Wu of the top 26 and smaller than the width W1 of the bottom. Accordingly, the width of the active area AA is smallest at the portion other than the bottom of the active area AA. "The width of the active area" means a length of the active area AA in the direction (the X direction) perpendicular to the direction of extension of the active area AA (the Y direction).

The position where the width of the active area AA is minimum is below the n-type diffusion region 20. For more details, the width Wm has a minimum value and a local minimum at the position 30 located in the middle portion 27 in the profile of the width of the active area AA in the Z direction. The position 30 is located below the lower end of the n-type diffusion region 20. In the profile of the width in the Z direction, the position at which the width starts decreasing in the up-to-down direction of the active area AA may be below the n-type diffusion region 20.

In the thus-constituted device 1, the source lines SL are connected to one ends of the active areas AA via the contact plugs 21, and the bit lines BL are connected to the other ends of the active areas AA via the contact plugs 22. Memory transistors including the charge storage members as the floating gate electrodes FG are disposed at the respective nearest portions of the control gate electrodes DG and the active areas AA to each other. At the nearest portions of the select gate electrodes SG and the active areas AA to each other, selection transistors are disposed. Thus, between the bit lines BL and the source line SL, a plurality of memory transistors are serially connected for the respective active areas AA. On both sides of them, memory strings with the selection transistors are disposed. In each memory string, the n-type diffusion region functions as the source/drain regions of the memory transistors and the selection transistor. A plurality of the memory strings from a memory cell array.

Next, the method for manufacturing the semiconductor memory device 1 according to this embodiment will be described.

FIGS. 4A to 4C, and FIGS. 5A and 5B are cross-sectional views in order of processes, illustrating the method for manufacturing the semiconductor memory device according to this embodiment.

Figure 4A:
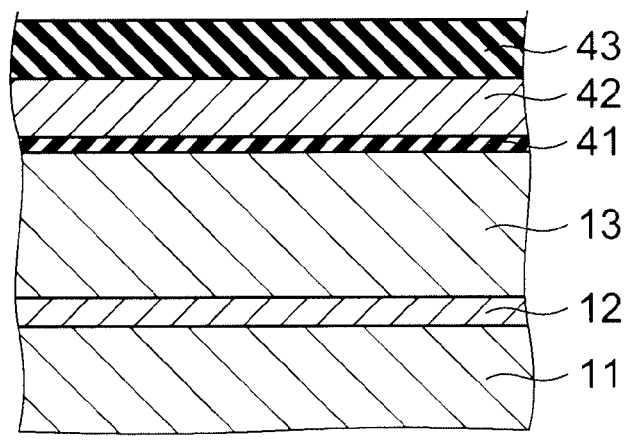
FIGS. 4A to 4C and FIGS. 5A and 5B are cross-sectional views in order of the processes, illustrating a method for manufacturing the semiconductor memory device according to the first embodiment.

As illustrated in FIG. 4A, a p-type silicon substrate 11 is prepared. The p-type silicon substrate 11 is a part of, e.g., a silicon wafer. In the silicon substrate 11, the memory array region and the peripheral circuit region are set.

In the memory array region, the n-type well 12 is formed in the silicon substrate 11 at an upper portion, and the p-type well 13 is formed in the n-type well 12 at an upper portion. On the p-type well 13, silicon oxide, for example, is deposited to form an insulating film 41. A conductive material, e.g., polysilicon or others with an impurity implanted is deposited to form a conduction film 43. An insulating film 43 is formed.

Figure 4B:
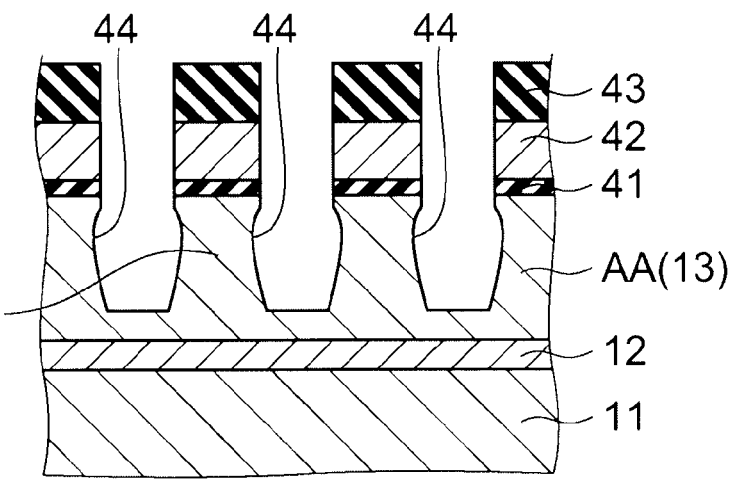

As illustrated in FIG. 4B, in the memory array region, a plurality of trenches 44 are formed, extended in the Y direction. Specifically, the insulating film 43 is patterned by photolithography to expose the regions for the trenches 44 to be formed in. The insulating film 43 is used the mask material. The conduction film 42, the insulating film 41 and the silicon substrate 11 are selectively removed by anisotropic etching, such as RIE (Reactive Ion Etching) or others using insulating film 43 as the mask. The trenches 44 passing through the insulating film 43, the conduction film 42 and the insulating film 42 partially into the p-type well 13 are formed. Resultantly, the conduction film 42 and the insulating film 41 are formed into a plurality of linear members extended in the Y direction, and an upper layer portion of the p-type well 13 are divided into a plurality of active areas AA extended in the Y direction.

At this time, parts of the side surfaces of the trenches 44 are bulged by optimizing the gas conditions in the above-described anisotropic etching or partial etching with a chemical liquid after the anisotropic etching. The width Wm of the middle portions 27 of the active areas AA is made smaller than the width Wu of the tops 26 and the width W1 of the bottoms 28. The process for this is not limited to the above-described process.

Figure 4C:
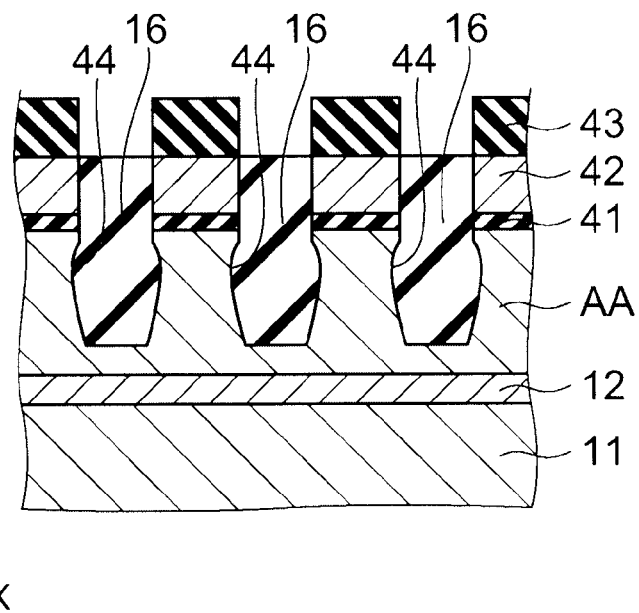

As illustrated in FIG. 4C, an insulating material, e.g., silicon oxide or others is buried in the trench 22 to form the element isolation insulators 16. At this time, the position of the upper surfaces of the element isolation insulators 16 is equal substantially to the position of the interface between the conduction film 42 and the insulating film 43. Then, the insulating film 43 is removed.

Figure 5A:
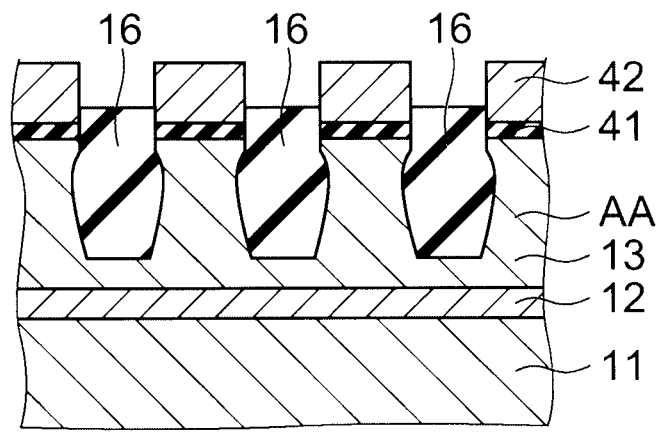

As illustrated in FIG. 5A, a resist film (not illustrated) is formed on the entire surface, and the memory array region is exposed by photolithography. An upper portion of the element isolation insulators 16 is etched by such as RIE or others using this resist film as the mask. The upper surfaces of the element isolation insulators 16 are lowered. At this time, the peripheral circuit region, which is covered with the resist film, is not etched. Then, the resist film is removed.

Figure 5B:
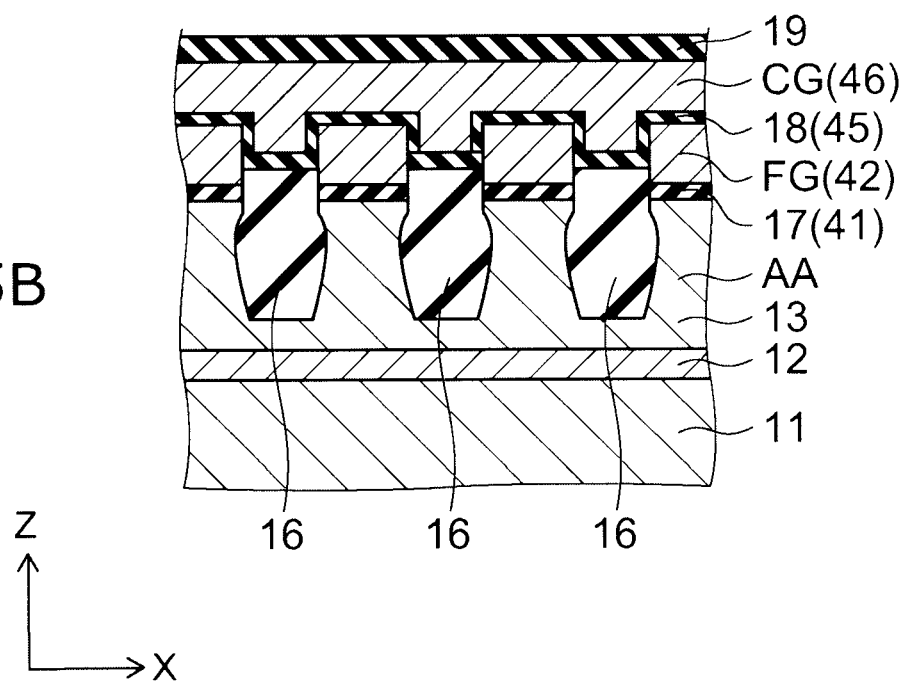

As illustrated in FIG. 5B, an insulating film 45 is formed on the conduction film 42, and a conduction film 26 is formed thereon. At this time, in the regions where the select gate electrodes SG are to be formed, the openings 18a (see FIG. 3) are formed in the insulating film 35. By photolithography, a plurality of patterns extended in the X direction are formed in the Y-direction a prescribed pitch. The conduction film 46, the insulating film 45 and the conduction film 42 are cut in the Y direction using a plurality patterns as the mask. The conduction film 46 is cut to be the linear control gate electrodes CG extended in the X direction, and the insulating film 45 is cut to be the linear inter-gate insulating film 18 extended in the X direction.

The conduction film 42 is cut to be the floating gate electrodes FG. The conduction film 42 is cut in the X direction in the process illustrated in FIG. 4B and cut in the Y direction in this process, whereby the floating gate electrodes FG are disposed in a matrix in the X direction and the Y direction. Furthermore, the floating gate electrodes FG and the control gate electrodes CG are connected to each other via the openings 18a to form the select gate electrodes SG. Also furthermore, the insulating film 41 cut in the X direction in the process illustrated in FIG. 4B becomes the tunnel insulating film 17 extended in the Y direction. An insulating film 19 is formed on the control gate electrodes CG and the select gate electrodes SG.

As illustrated in FIGS. 1 to 3, with the control gate electrodes CG and the select gate electrodes SG as the mask, impurities as a donor are ion implanted into the silicon substrate 11. The n-type diffusion regions 20 are formed by self-alignment in the regions of upper layer portions of the active areas AA, which sandwich the areas very below the control gate electrodes CG and the select gate electrodes SG.

On the silicon substrate 11, an insulating material of silicon oxide or others is deposited, covering the tunnel insulating film 17, the floating gate electrodes FG, the inter-gate insulating film 18, the control gate electrodes CG and the insulating film 19 to form the inter-layer insulating film 25. The contact holes are formed in the inter-layer insulating film 25 by lithography, and in these contact holes, a high melting point metal, such as tungsten (W), molybdenum (Mn) or others, is buried to form the contact plugs 21, 22, etc. For example, aluminum (Al), aluminum copper alloy (AlCu) or others is deposited and processed into lines by anisotropic etching to form the bit lines BL and the source lines SL. The silicon wafer is diced into the silicon substrates 11. The semiconductor memory device 1 according to this embodiment is manufactured.

Next, the operational effects of this embodiment will be described.

Figure 6:
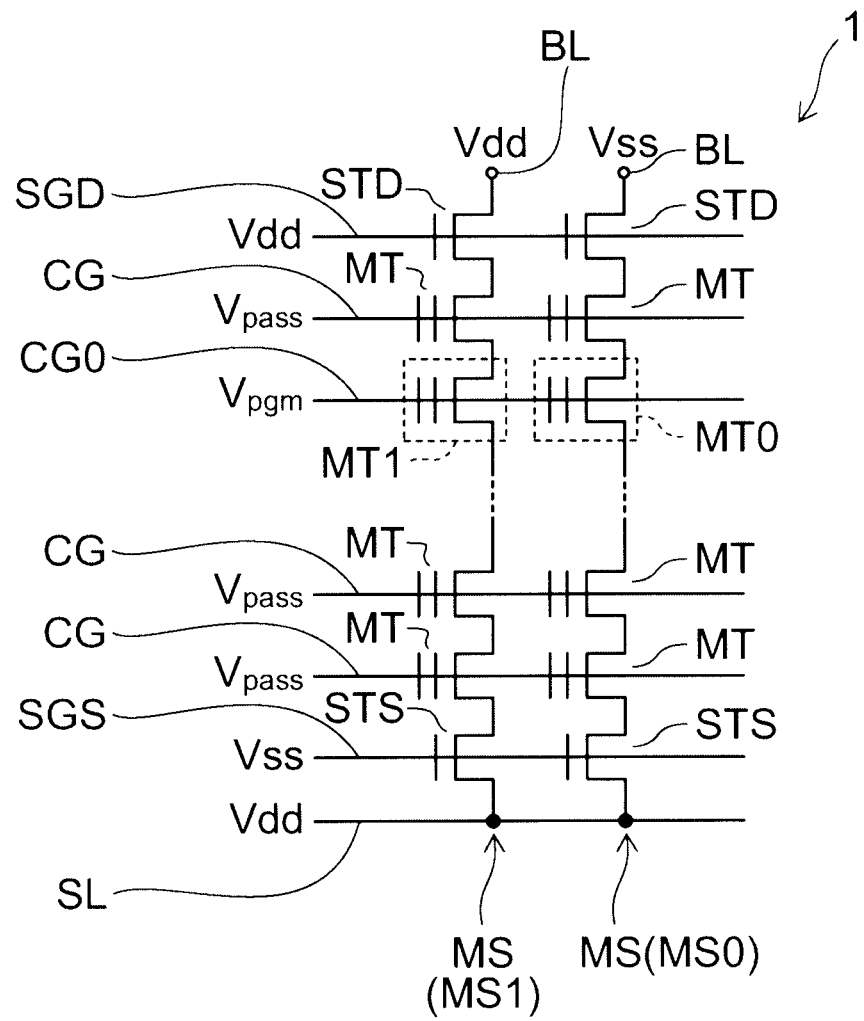
FIG. 6 is a circuit diagram illustrating the write operation of the semiconductor memory device according to the first embodiment.

FIG. 6 is a circuit diagram exemplifying the write operation of the semiconductor memory device according to this embodiment.

Figure 7A:
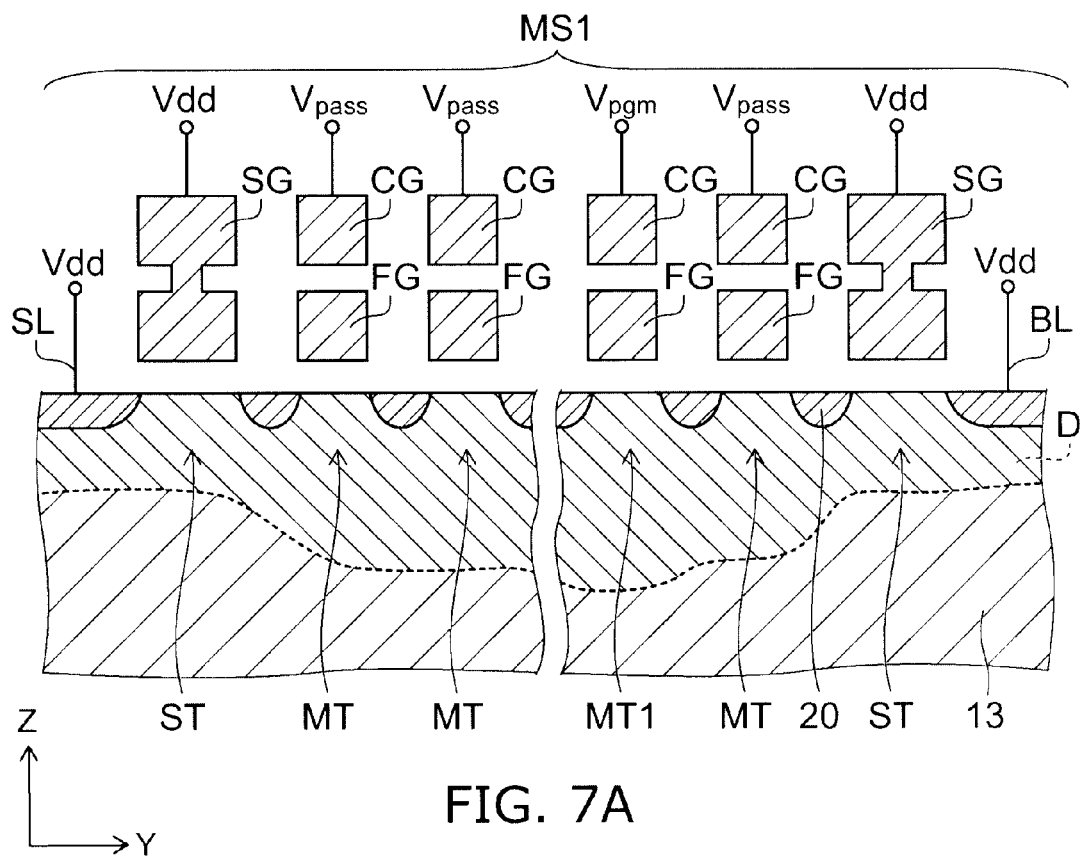
FIG. 7A is a schematic cross-sectional view illustrating a memory string adjacent to a memory string to be written.
Figure 7B:
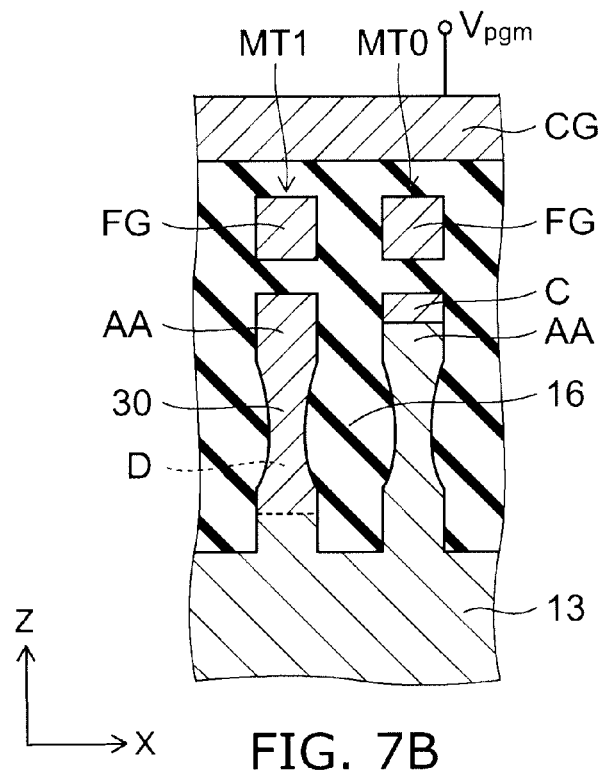
FIG. 7B is a schematic cross-sectional view illustrating a memory transistor to be written and its adjacent memory transistor.

FIG. 7A is a schematic cross-sectional view exemplifying a memory string adjacent to a memory string to be written. FIG. 7B is a schematic cross-sectional view exemplifying the transistor to be written and its adjacent memory transistor.

As illustrated in FIG. 6, a memory string MS is disposed for each active area AA. Each memory string MS is connected between a bit line BL and a source line SL. In each memory string MS, a pair of a selection transistor ST including a selection transistor STD on the side of the bit line BL and a selection transistor STS on the side of the source line SL, a plurality of the memory transistors MT disposed between the pair of selection transistors STD, STS are alternately serially connected. The select gate electrodes SG of the selection transistors STD, STS are called respectively "the select gate electrode SGD" and "the select gate electrode SGS".

In the device 1, when data is stored in one memory transistor MT (hereinafter called "a select-memory transistor MT0"), for example, the potential of the source line SL is a positive potential Vdd (e.g., 2.5 V), and the potential of the bit line BL connected to a memory string MS (hereinafter called "a select-string MS0" associated with the select-memory transistor MT0 is a reference potential Vss (e.g., 0 v). On the other hand, the potential of the bit line connected to a memory string MS other than the string to be written MS0 (hereinafter called "a non-select-string MS1") is a positive potential Vdd (e.g., 2.5 V). The potential of the select gate electrode SGD is a positive potential Vdd, and the potential of the select gate electrode SGS is a grand potential Vss. The potential of the control gate electrode CG of the select-memory transistor MT0 (hereinafter called "select-gate electrode CG0") is write potential $V_{pgm}$ (e.g., 20 V), and the potential of the control gate electrodes CG other than the select-gate electrode CG0 is an intermediate potential $V_{pass}$ (e.g., 10 V). A memory transistor the data is not to be written in is called "a non-select-memory transistor MT1".

Thus, in the to-be-written string MS0, the selection transistor STD on the side of the bit line BL is turned on, and the reference potential Vss (e.g., 0 V) is applied to the active area AA. To the control gate electrode CG, the intermediate potential $V_{pass}$ (e.g., 10 V) or the programming potential $V_{pgm}$ (e.g., 20 V) is applied, which turns on all the memory transistors MT associated with the select-string MS0. Of all the memory transistors, to the select-memory transistor MT0, the write potential $V_{pgm}$ (e.g., 20 V) is applied, which, in the select-memory transistor MT0, the voltage (gate voltage) between the active area AA and the select-gate electrode CG0 becomes especially high, and electrons are injected from the active area AA to the floating gate electrode FG via the tunnel insulating film 17. Resultantly, the data is stored in the select-memory transistor MT0.

In the non-select-string MS1, however, the selection transistors ST positioned on both ends of the memory string MS1 are turned off, and the active area AA is floating. Thus, the potential of the active area AA rises due to the capacity coupling between the potential (the write potential $V_{pass}$) of the select-gate electrode CG0 and the potential (the intermediate potential $V_{pass}$) of the control gate electrodes CG other than the select-gate electrode CG0. Resultantly, the voltage (the gate voltage) between the active area AA and the select-gate electrode CG0 becomes lower than the gate voltage of the select-memory transistor MT0. Thus, no electrons are injected into the floating gate electrode FG, and the data is not stored in.

As illustrated in FIG. 7B, the middle portions of the active areas AA are thinner than the tops 26 and the bottoms 28. The distance between the middles portions 27 of the adjacent active areas AA is larger than the distances between the tops 26 and between the bottoms. Substantially, the distance between the adjacent whole active areas becomes large. Resultantly, at this time, interference between the adjacent active areas AA via the element isolation insulator 16 is not easily accrued.

As described above, in the select-string MS0, the selection transistor STD is turned on, and as illustrated in FIG. 7B, a channel C is formed in the area very below the floating gate electrode FG in the portion corresponding to the select-memory transistor MT0 of the active area AA. On the other hand, as illustrated in FIGS. 7A and 7B, in the non-select-string MS1, the active area AA is floating state, and because of the higher potential of the control gate electrode CG in comparison with the potential of the active area AA, inside the active area AA, a depletion layer D is formed at the upper surface of the active memory area AA. As the width of the depletion layer D is smaller, the depletion layer capacity of the depletion layer D is smaller. Then, the gate capacity of the memory transistor MT, i.e., the capacity between the active areas AA via the control gate electrode CG, the depletion layer D, etc. becomes smaller.

As illustrated in FIG. 7B, in this embodiment, the middle portion 27 of the active area AA is made thinner, whereby the volume of the active area AA is decreased to improve the column boost ratio so as to extend the depletion layer deeper. Resultantly, the bottom surface of the depletion layer D is positioned, e.g., below the position 30. That is, the gate capacity can be made small, whereby the programming error in the non-select-memory transistor MT1 can be decreased.

Because of the large width of the depletion layer D of the memory transistor MT (the deep bottom of the depletion layer D), the memory transistor MT is less vulnerable to the potential change of the adjacent active area AA. With the selection transistor STD of the select-string MS0 turned on, a channel C is formed below the floating gate electrode FG of the select-memory transistor MT0. With the small depletion layer capacity of the depletion layer D of the non-select-string MS1, the electric field to be applied from the active area AA of the non-select-string MS1 to the active area AA of the select-string MS0 can be mitigated. Resultantly, programming error in the select-string MT0 can be prevented.

However, when the whole active area AA is uniformly thin, the cell current flowing in the active area AA decreases. In this embodiment, the top 26 is made relatively thick, and the middle portion 27 is made relatively thin. As a result, the cell current flowing in the top 26 is ensured while the volume of the whole active area AA is decreased. Then the column boost ratio is improved to make the depletion layer extendable downward. Resultantly, the gate capacity can be decreased, and the interference between the memory cell transistors can be suppressed. Thus, the programming error in the memory cell transistors is prevented, and the reliability can be improved.

In the active area AA, the portion where the cell current mainly flows is the portion between the n-type diffusion regions 20, which function as the source/drain regions. Then, in this embodiment, the position 30 of the active area AA, where the width is minimum is below the bottom of the n-type diffusion regions 20. Thus, the position 30, where the width is minimum, is hindered from positioning in the portion between the n-type diffusion regions 20, where the cell current mainly flows to thereby ensure sufficient cell current. Specifically, the interface between the top 26 and the middle portion 27, i.e., the position where the active area AA starts thinning in the direction of extension from the top 26 to the middle portion 27 is positioned below the bottoms of the n-type diffusion regions 20. Then the cell current can be surely larger.

Furthermore, if the depletion layer exceeds the lower end of the element isolation insulator 16 into the adjacent active area AA, punch-through between the active area AA and the adjacent active area AA is occurred. That is, current flows from the active area AA of the non-select-string MS1 to the active area AA of the select-string MS0. Then programming error in the non-select-string MT1 is occurred. Then, in this embodiment, the bottom 28 of the active area AA is made thicker than the middle portion 27. Thus, the depletion layer rapidly extends downward in the middle portion 27 as the gate voltage increases but is hindered from extending downward in the bottom 28. Resultantly, the lower end of the depletion layer tends to position in the bottom 28, and the depth of the depletion layer becomes stable. Thus, the sufficient depth of the depletion layer is ensured while the depletion layer can be prevented from exceeding a bottom of the element isolation insulator 16. As described above, this embodiment can suppress the interference between the memory transistors even with the distance between the active areas AA reduced for high integration of the memory transistors.

Next, a control of this embodiment will be described.

Figure 8:
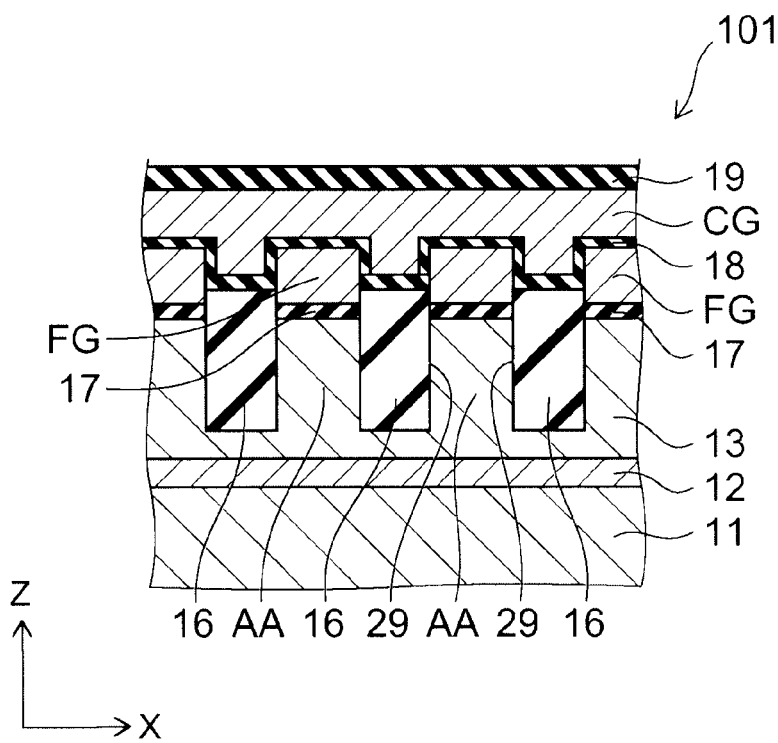
FIG. 8 is a cross-sectional view illustrating a semiconductor memory device according to a comparative example of the first embodiment.

FIG. 8 is a cross-sectional view exemplifying the semiconductor memory device according to this control.

As illustrated in FIG. 8, in the semiconductor memory device 101 according to this control, the sectional form of the active area AA is rectangular. That is, as viewed in the Y direction, the side surfaces 29 of the active area AA are linearly extended in the Z direction.

In the semiconductor memory device 101, the width of the active area AA is constant in the Z direction, which, to surely make the cell current sufficient, the volume of the active area AA becomes large, and the depletion layer is not easily extended downward. Accordingly, the gate capacity becomes large, and interference becomes strong between the active areas AA. Resultantly, a programming operation in a memory transistor tends to cause a programming error in its adjacent memory transistor, and the reliability is lowered.

Next, modifications of the first embodiment described above will be described.

First, a first modification will be described.

Figure 9:
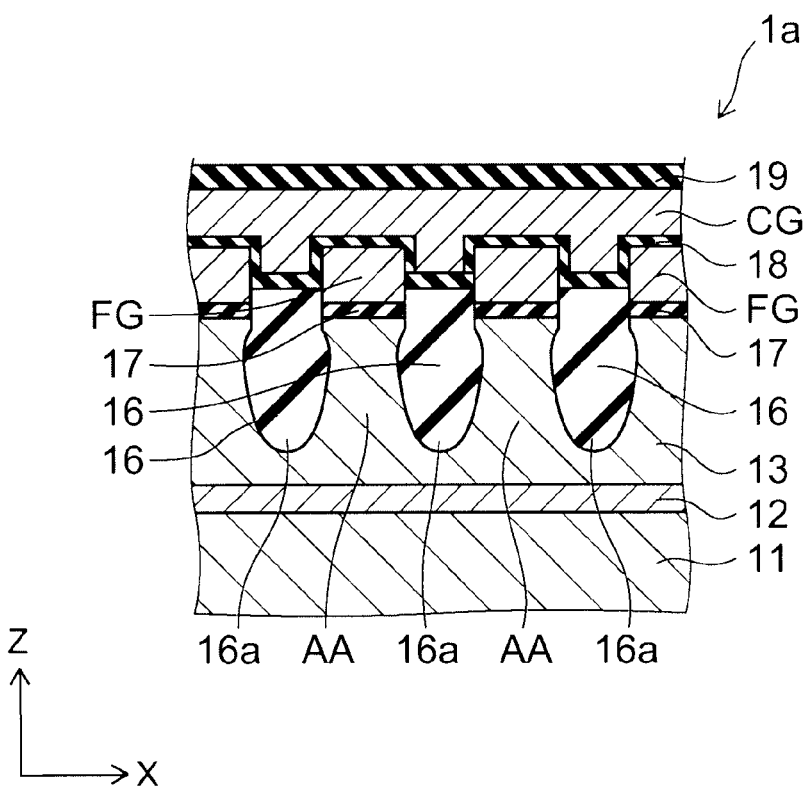
FIG. 9 is a cross-sectional view illustrating a semiconductor memory device according to a first variation of the first embodiment.

FIG. 9 is a cross-sectional view exemplifying the semiconductor memory device according to this modification.

As illustrated in FIG. 9, in the semiconductor memory device 1a according to this modification, the lower end 16a of the ST1 16 is rounded and tapered downward. It is possible to smoothly spread a skirt of the active area AA, which can prevent the collapse of the active area AA in the process of burying the element isolation insulator 16 following the process of forming the trench. The width of the active area AA abruptly increased toward the lower end, which more effectively prevents the extension of the depletion layer in the bottom 28. The constitution and the operation effects of this modification except those described above are the same as those of the first embodiment described above.

Next, a second modification will be described.

Figure 10:
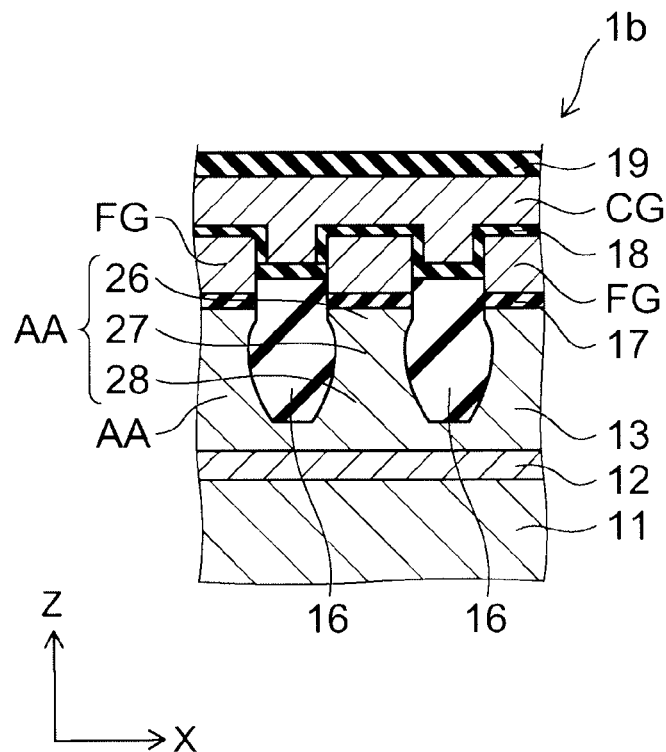
FIG. 10 is a cross-sectional view illustrating a semiconductor memory device according to a second variation of the first embodiment.

FIG. 10 is a cross-sectional view exemplifying the semiconductor memory device according to this modification.

As illustrated in FIG. 10, in the semiconductor memory device 1b according to this modification, the sectional form of the bottom 28 of the active area AA is a trapezoid having the width increased downward and having a substantially flat bottom surface. This also can prevent the collapse of the active area AA in the manufacturing process of the semiconductor memory device 1b. The bottom 28 of the active area AA is made continuously thick downward, whereby the extension of the deletion layer can be effectively prevented. The sectional form of the bottom 28, whose bottom surface is substantially flat, can mitigate the concentration of electric fields in the bottom 28. Resultantly, the generation of punch-through between the adjacent active areas AA can be more effectively prevented. The constitution and the operational effects of this modification except those described above are the same as those of the first embodiment described above.

Next, a third modification will be described.

Figure 11:
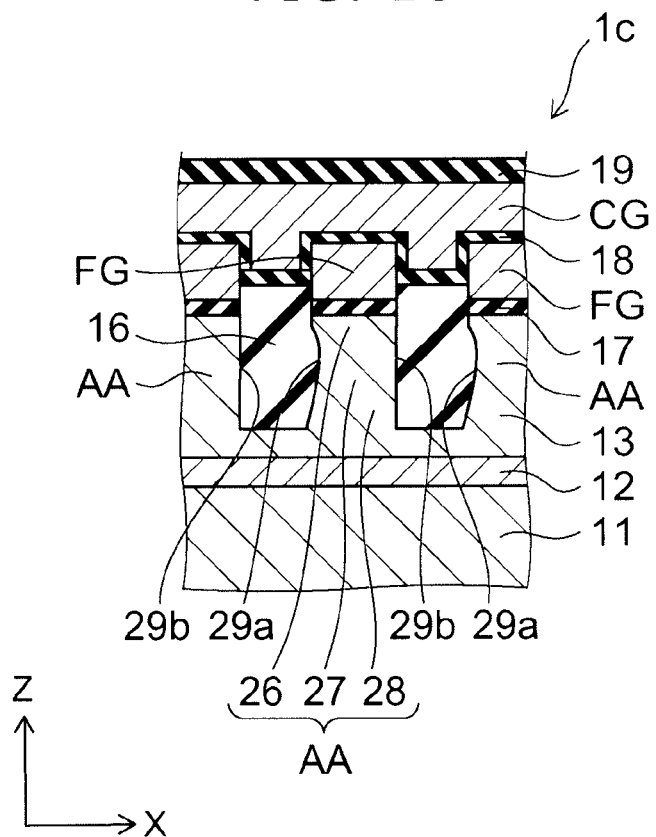
FIG. 11 is a cross-sectional view illustrating a semiconductor memory device according to a third variation of the first embodiment.

FIG. 11 is a cross-sectional view exemplifying the semiconductor memory device according to this modification.

As illustrated in FIG. 11, in the semiconductor memory device 1c according to this modification, the middle portion 27 of the active area AA has one side surface 29a alone made concave. The other side surface 29b is not concave and flat. That is, the configuration of the active area AA is asymmetric in the direction of the width (X direction). This can produce the same effects as in the first embodiment described above. The constitution and the operation effects of this modification except those described above are the same of the first embodiment described above.

Next, a fourth modification will be described.

Figure 12:
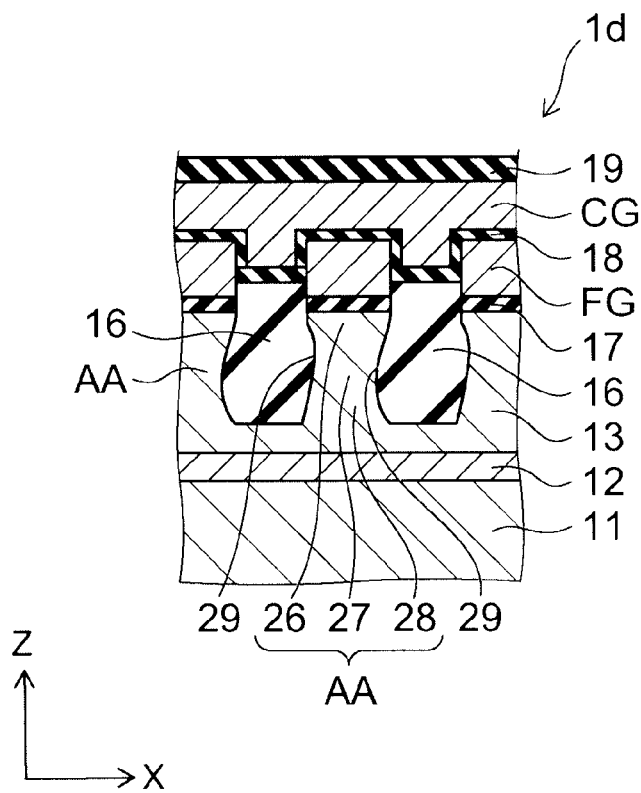
FIG. 12 is a cross-sectional view illustrating a semiconductor memory device according to a fourth variation of the first embodiment.

FIG. 12 is a cross-sectional view exemplifying the semiconductor memory device according to this modification.

As illustrated in FIG. 12, in the semiconductor memory device 1d according to this modification, both side surfaces 29 of the active area AA are concave at the middle portion 27, but the configuration of the active area AA is asymmetric in the width direction, and the concavities are asymmetric. This as well can produce the same effects of the first embodiment described above. The constitution and the operational effects of this modification except those described above are the same as those of the first embodiment descried above.

As exemplified in the first to the fourth modifications described above, the active area AA is not limited to a specific configuration as far as the middle portion 27 in the up-to-down direction (Z direction) is thinner than the top 26 and the bottom 28.

Next, a fifth modification will be described.

Figure 13:
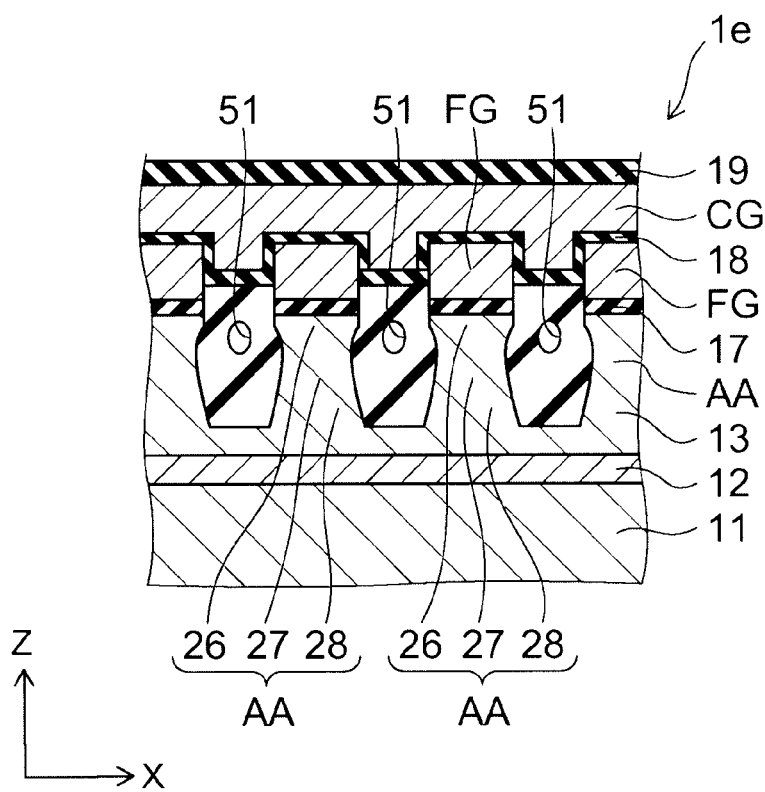
FIG. 13 is a cross-sectional view illustrating a semiconductor memory device according to a fifth variation of the first embodiment.

FIG. 13 is a cross-sectional view exemplifying the semiconductor memory device according to this modification.

As illustrated in FIG. 13, in the semiconductor memory device 1e according to this modification, a void 51 is formed in the portion sandwiched by the middle portions 27 in the element isolation insulators 16. This makes the inside of the void 51 an air gap and the capacity between the active areas AA can be decreased. The constitution and the operation effects of this modification except those described above are the same as those of the first embodiment.

Next, a second embodiment of this invention will be described.

Figure 14A:
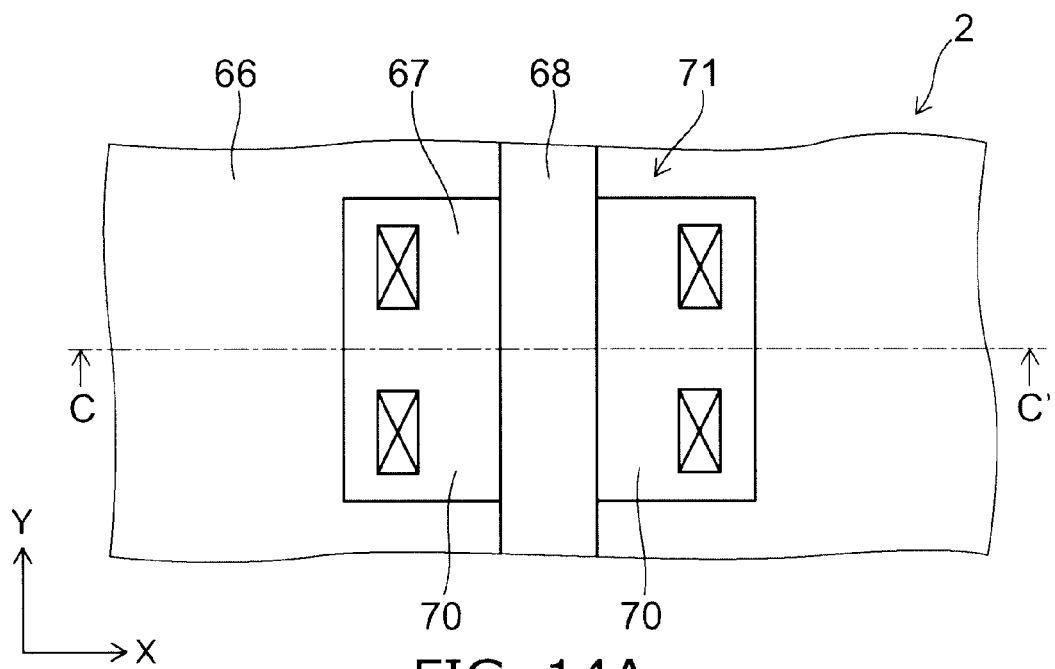
FIG. 14A is a plan view illustrating a high voltage transistor of a semiconductor memory device according to a second embodiment of the invention.
Figure 14B:
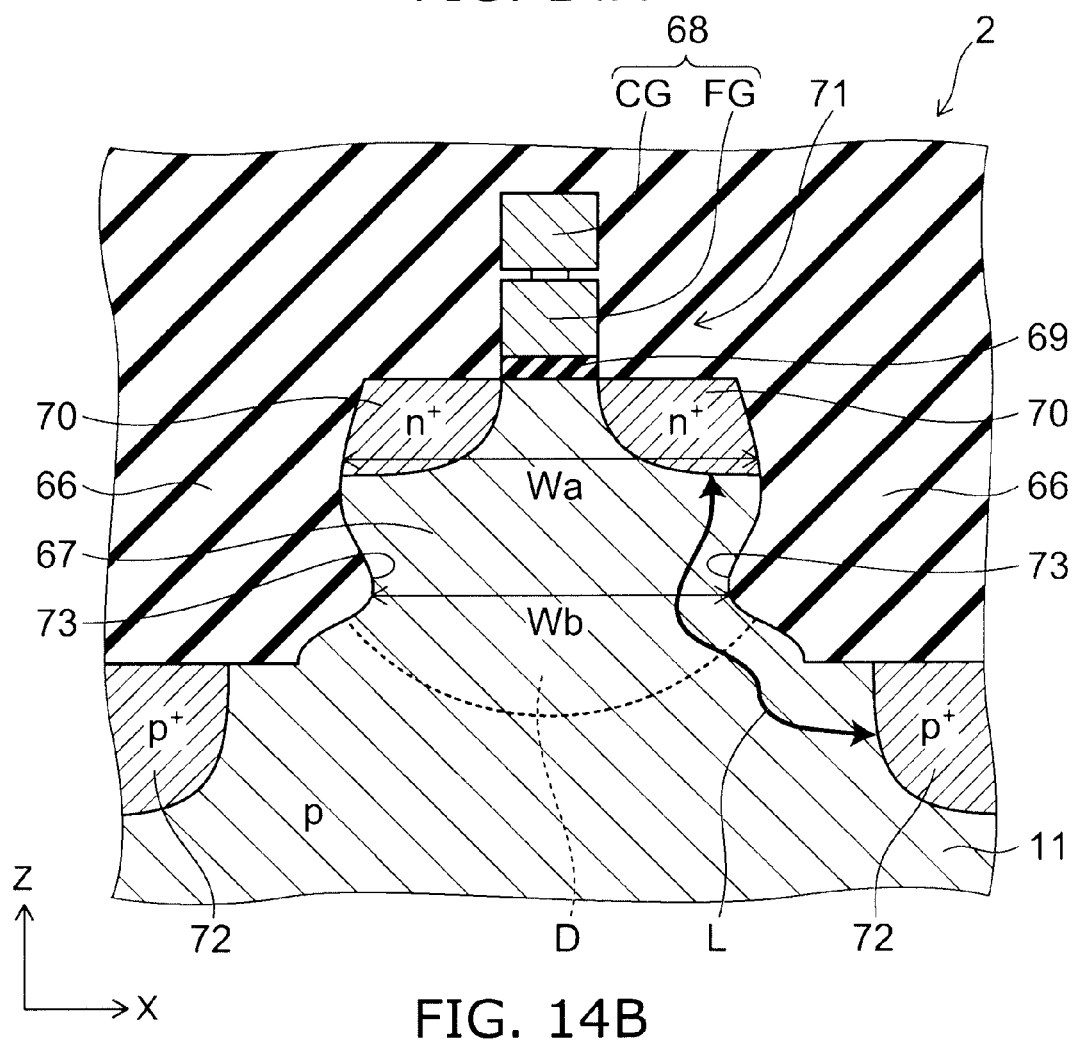
FIG. 14B is a cross-sectional view along the C-C' line in FIG. 14A.

FIG. 14A is a plan view exemplifying the high voltage transistors of the semiconductor memory device according to this modification. FIG. 14B is the cross-sectional view along the C-C' line in FIG. 14A.

This embodiment is the same as the first embodiment described above except that, in addition to the first embodiment described above, high voltage transistors are provided in the peripheral region positioned around the memory array region, and the semiconductor region where the high voltage transistors are disposed is contracted below the source/drain regions. The configuration of this embodiment other than the above configuration is the same as that of the first embodiment described above. That is, in the memory array region of the semiconductor memory device according to this embodiment, the same memory cell array as that of the first embodiment described above.

As illustrated in FIGS. 14A and 14B, in the semiconductor memory device 2 according to this embodiment (hereinafter called simply "the device 2"), in the peripheral circuit region, element isolation insulators 66 are disposed at parts of an upper layer portion of a p-type silicon substrate 11 and divide the upper layer portion of the silicon substrate 11 into semiconductor regions 67. As viewed from above (in the Z direction), the configuration of the semiconductor regions 67 is rectangular. Above the silicon substrate 11, linear gate electrodes 68 extended in, e.g., the Y direction are disposed, crossing the areas very above the central portions of the semiconductor regions 67. The gate electrodes are disposed simultaneously with the floating gate electrodes FG and the control gate electrodes CG in the memory array region and, as are the select gate electrodes SG in the memory array region (see FIG. 3), are disposed with polysilicon forming the floating gate electrodes FG and polysilicon forming the control gate electrodes CG mutually connected. The gate electrodes 68 may be extended in the X direction.

A gate insulating film 69 of, e.g., silicon oxide is disposed between the semiconductor regions 67 and the gate electrodes 68. The gate insulating film 69 is thicker than the tunnel insulating film 17 (see FIG. 3). A part of the gate insulating film 69 may be disposed simultaneously with the tunnel insulating film 17 in the memory array region (see FIG. 3). Furthermore, in the regions sandwiching the area very below the gate electrode 68 in each semiconductor region 67, i.e., on both ends of the semiconductor region 67 in the X direction, a pair of source/drain regions 70 of the n⁺-conduction type is formed. Thus, in the device 2, high voltage transistors 71 are disposed in the semiconductor regions 67.

Furthermore, in the device 2, in the areas of the silicon substrate 11 very below each element isolation insulator 66, p-wells 72 of the p⁺-conduction type are formed. The p-wells 72 are in contact with the underside of the element isolation insulator 66, and the effective impurity concentration is higher than the effective impurity concentration of the silicon substrate 11. The p-wells 72 are for electrically isolating the high voltage transistors 71 from the surroundings.

In the device 2, the portions of each element isolation insulator 66, which are in contact with the semiconductor region 67, are projected toward the inside of the semiconductor region 67 below the source/drain regions 70. This makes the width Wb of the lower portion of the semiconductor region 67, i.e., the portion below the portion where the source/drain regions 70 are formed smaller than the width Wa of the upper portion of the semiconductor region 67, i.e., the portion where the source/drain regions 70 are formed. Thus, concavities 73 are disposed in the lower portions of the semiconductor regions 67. The width of the semiconductor regions 67 is smallest at the portion other than the lower ends of the semiconductor regions 67.

Next, the operational effects of this embodiment will be described.

In this embodiment, the lower portions of the semiconductor regions 67 are concave as described above, which decreases the volume of the whole semiconductor region 67 isolated by the element isolation insulator 66 and makes the depletion layer D formed in the semiconductor region 67 accordingly extendable downward. Thus, the capacity between the portion of the silicon substrate 11 except the depletion layer D and the gate electrode 68, i.e., the substrate capacity as viewed from the gate electrode 68 decreases. Resultantly, the substrate bias characteristics are good, and the transfer ability of the high voltage transistor 71 is improved. The semiconductor region 67 is concave at the lower portion, i.e., the portion below the portion where a pair of source/drain regions 70 is disposed, whereby the channel width of the high voltage transistor 71 (the Y direction width of the intersection between the semiconductor region 67 and the gate electrode 78) is not small. Resultantly, the current flowing between the source/drain regions 70 is not decreased, and sufficient source/drain current can be ensured.

The lower portion of the semiconductor region 67 is concave, which makes the three-dimensional current path L between the source/drain regions 70 and the p-type well 72 is longer than the straight distance between the source/drain regions 70 and the p-type well 72. It is difficult for the depletion layer D generated at the interface between the p-semiconductor substrate 11 and the n⁺-source/drain regions 70 to arrive at the p-type well 72. Then, the junction voltage resistance of the high voltage transistor 71 is improved. Especially, in the high voltage transistor 71, which may transfer high voltages, the semiconductor region 67 of such configuration is used, whereby the above-described effects can be effectively produced.

Furthermore, the semiconductor memory device 2 according to this embodiment can be manufactured by the same method for manufacturing the semiconductor memory device 1 according to the first embodiment described above. That is, the peripheral circuit region containing the high voltage transistors 71 in this embodiment can be formed by the same process as the process of forming the memory array region. Resultantly, the semiconductor memory device according to this embodiment can be manufactured without increasing the number of processes in comparison with the first embodiment. The operation effects other than the above-described operational effects of this embodiment are the same as those of the first embodiment described above.

The element isolation insulators 16 of the memory array region and the element isolation insulators 66 of the peripheral circuit region may be formed by different processes.

Usually, the width of the element isolation insulator 66 formed around the high voltage transistor 71 is larger than the width of the element isolation insulator 16 formed between the active areas AA, when both are formed under the same conditions, it is often difficult to control with good precision both the configuration of the semiconductor region 67 and the configuration of the active area AA. In such case, the element isolation insulator 16 and the element isolation insulator 66 are formed by different processes, whereby the configuration of the active area AA and the configuration of the semiconductor region 67 are controlled independent of each other, and the position where the middle portion 27 of the active area AA is formed and the position where the concavity of the semiconductor region 67 is formed can be both controlled accurately.

Next, a control of this embodiment will be described.

Figure 15A:
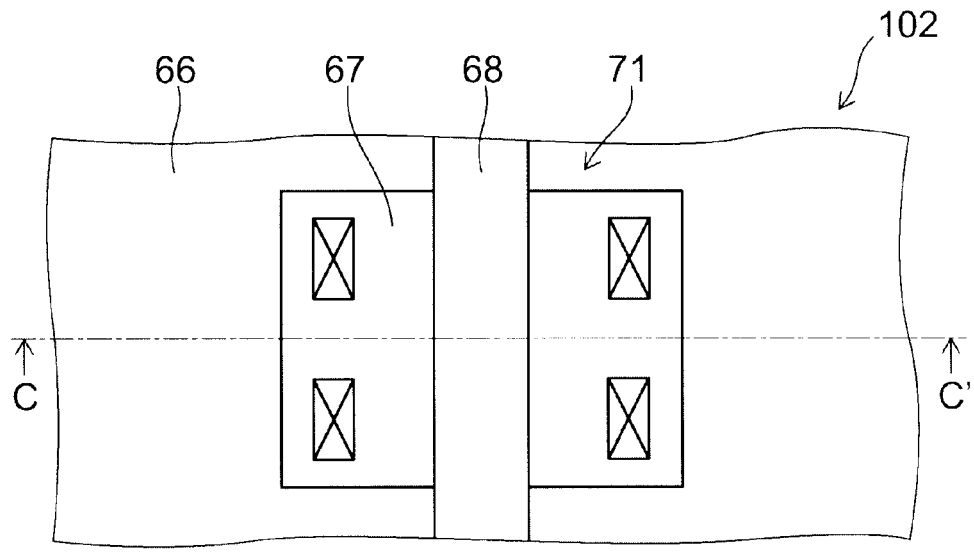
FIG. 15A is a plan view illustrating a high voltage transistor of a semiconductor memory device according to a comparative example of the second embodiment.
Figure 15B:
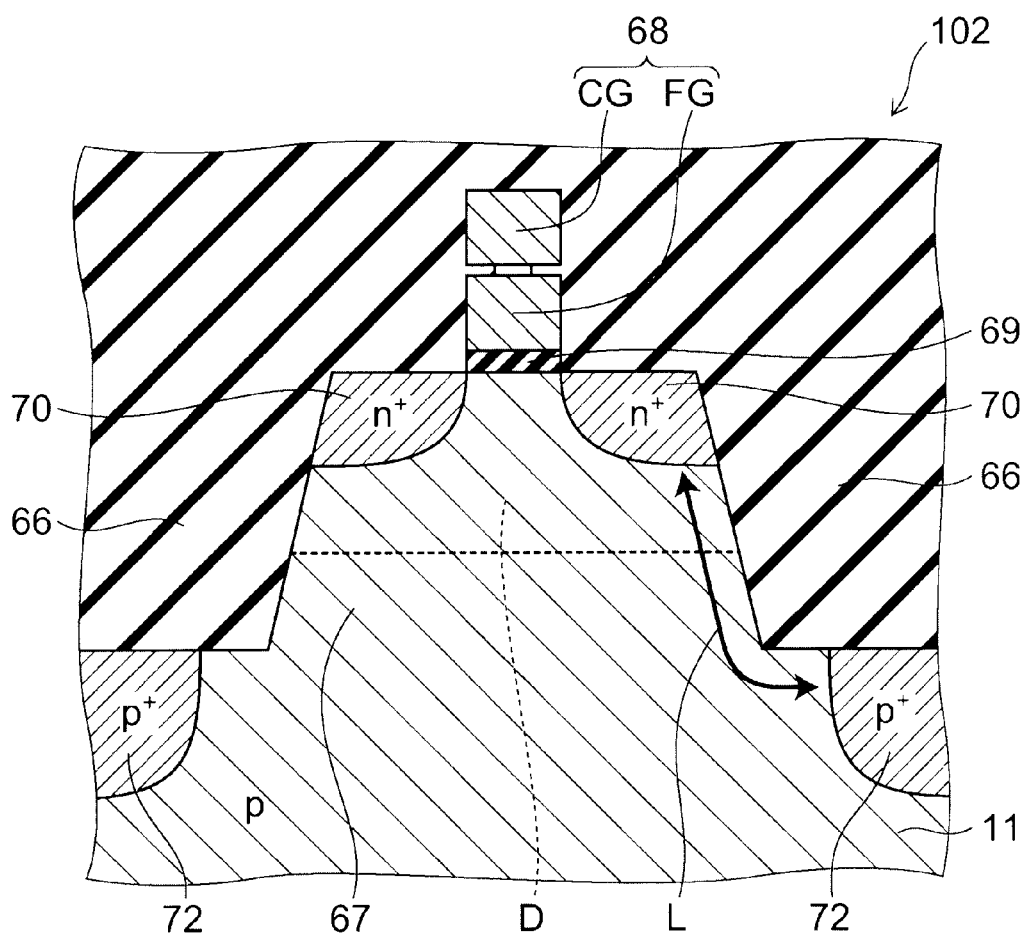
FIG. 15B is a cross-sectional view along the C-C' line in FIG. 15A.

FIG. 15A is a plan view exemplifying the high voltage transistor of the semiconductor memory according to this control. FIG. 15B is the cross-sectional view along the C-C' line in FIG. 15A.

As illustrated in FIGS. 15A and 15B, in the semiconductor memory device 102 according to this control, the lower portion of the semiconductor region 67 has no concavity, and the interface between the semiconductor region 67 and the element isolation insulator 66 is flat.

In this control, the lower portion of the semiconductor region 67 is not concave, which makes it difficult for the depletion layer to extend downward, and the substrate capacity as viewed from the gate electrode 68 is large. Accordingly, the substrate bias characteristics are bat, and the transfer ability of the high voltage transistor 71 is low. In order to make the current path L long to thereby ensure the junction voltage resistance, the straight distance between the source/drain regions 70 and the p-type well 72 should be large, which it is difficult to downsize the inter-element area.

This invention has been described with reference to embodiments and variations thereof, but this invention is not limited thereto. The respective embodiments and the respective variations described above can be practiced in mutual combinations. The respective embodiments and the respective variations described above which those skilled in the art suitably add components to, delete the components from and/or make design changes to, and/or those skilled in the art suitably add processes to, delete the processes from and/or make condition changes to are contained in the scope of this invention as far as they have the spirits of this invention. For example, in the first embodiment described above, as the charge storage member, the use of the floating gate electrode of a conductive material is exemplified. However, this invention is not limited thereto and may use a charge storage film of an insulating material as the charge storage member. For example, the semiconductor memory device may be a MONOS (Metal-Oxide-Nitride-Oxide-Silicon) memory device. In the respective embodiment the respective variations described above, the memory transistor may be multi-valued transistors.

The invention claimed is:

1. A semiconductor memory device comprising:
a semiconductor substrate;
an element isolation insulator disposed in an upper layer portion of the semiconductor substrate and partitioning the upper layer portion into a semiconductor region;
a gate electrode provided on a part of an area immediately above the semiconductor region;
a gate insulating film provided between the semiconductor region and the gate electrode;
a source region formed in the semiconductor region; and
a drain region formed in the semiconductor region,
a region of the semiconductor region immediately below the gate electrode being located between the source region and the drain region,
a width in a direction to the drain region from the source region of a lower portion of the semiconductor region that does not include the source region and the drain region, and that is below an upper portion including the source region and the drain region, being smaller than a width in the direction to the drain region from the source region of the upper portion to form concavities at the lower portion.

2. The device according to claim 1, further comprising:
a well formed in an area of the semiconductor substrate immediately below the element isolation insulator, having a same conduction type as a conduction type of the semiconductor region, and having an impurity concentration higher than an impurity concentration of the semiconductor region.

3. The device according to claim 1, wherein
both side surfaces in the direction to the drain region from the source region of the semiconductor region are concave at the lower portion.

4. The device according to claim 1, further comprising a memory cell, the memory cell including:
a tunnel insulating film provided on the semiconductor substrate;
a charge storage member provided on the tunnel insulating film; and
a control gate electrode provided on the charge storage member.

5. The device according to claim 1, wherein
the gate electrode, the gate insulating film, the source region and the drain region form a high voltage transistor.

* * * * *